(12) United States Patent
Lee et al.

(10) Patent No.: US 7,411,261 B2
(45) Date of Patent: Aug. 12, 2008

(54) MEMS DEVICE AND FABRICATION METHOD THEREOF

(75) Inventors: Eun-sung Lee, Daejeon (KR); Chung-woo Kim, Sungnam (KR); In-sang Song, Seoul (KR); Jong-seok Kim, Gyunggi-do (KR); Moon-chul Lee, Sungnam (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 429 days.

(21) Appl. No.: 10/773,312

(22) Filed: Feb. 9, 2004

(65) Prior Publication Data
US 2004/0155306 A1 Aug. 12, 2004

Related U.S. Application Data

(62) Division of application No. 10/384,495, filed on Mar. 10, 2003, now Pat. No. 6,720,201.

(30) Foreign Application Priority Data
Mar. 11, 2002 (KR) ............................... 2002-12985

(51) Int. Cl.
*H01L 29/84* (2006.01)
(52) U.S. Cl. ...................... 257/415; 257/254
(58) Field of Classification Search ................ 257/234, 257/252–254, 414–420; 438/48, 50, 52, 438/53
See application file for complete search history.

(56) References Cited

U.S. PATENT DOCUMENTS 5,367,136 A 11/1994 Buck
6,013,573 A 1/2000 Yagi
6,210,988 B1 4/2001 Howe et al.
6,440,766 B1 8/2002 Clark
6,511,859 B1 1/2003 Jiang et al.
6,531,668 B1 * 3/2003 Ma ............................. 200/181
2003/0122205 A1 7/2003 Lee et al.
2004/0000696 A1 * 1/2004 Ma et al. ..................... 257/415

FOREIGN PATENT DOCUMENTS

| JP | 09-213191 | 8/1997 |
|---|---|---|
| JP | 2001-347500 | 12/2001 |
| WO | WO 01/01434 | 1/2001 |
| WO | WO 01/56920 | 8/2001 |
| WO | WO 02/16150 | 2/2002 |

* cited by examiner

Primary Examiner—Hung Vu
(74) Attorney, Agent, or Firm—Lee & Morse, PC.

(57) ABSTRACT

A method for fabricating a MEMS device having a fixing part fixed to a substrate, a connecting part, a driving part, a driving electrode, and contact parts, includes patterning the driving electrode on the substrate; forming an insulation layer on the substrate; patterning the insulation layer and etching a fixing region and a contact region of the insulation layer; forming a metal layer over the substrate; planarizing the metal layer until the insulation layer is exposed; forming a sacrificial layer on the substrate; patterning the sacrificial layer to form an opening exposing a portion of the insulation layer and the metal layer in the fixing region; forming a MEMS structure layer on the sacrificial layer to partially fill the opening, thereby forming sidewalls therein; and selectively removing a portion of the sacrificial layer by etching so that a portion of the sacrificial layer remains in the fixing region.

11 Claims, 7 Drawing Sheets

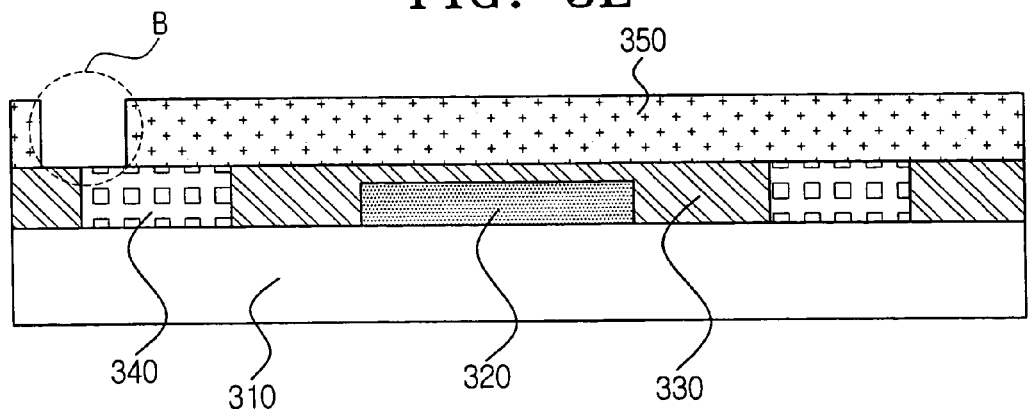
FIG. 3E
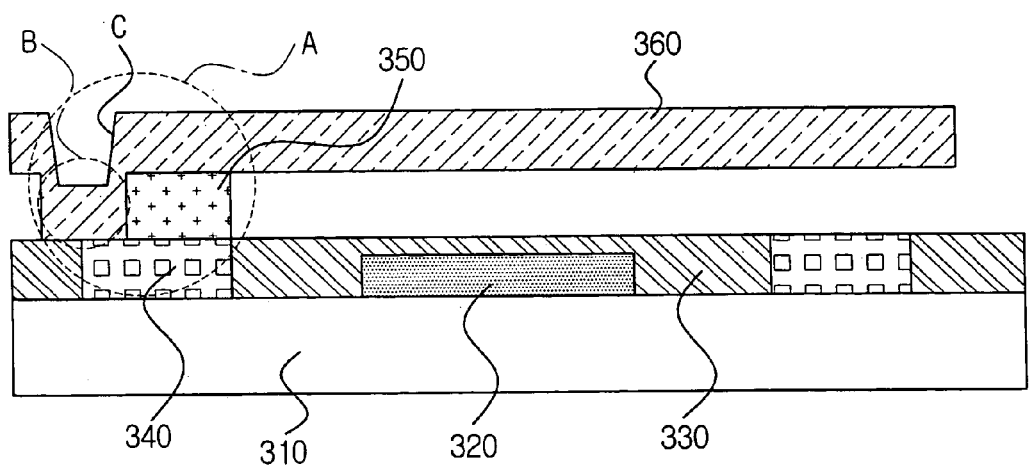
FIG. 3F
FIG. 4A
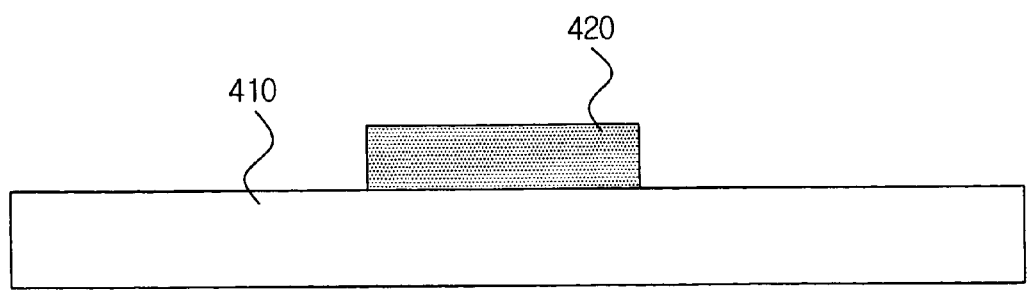

MEMS DEVICE AND FABRICATION METHOD THEREOF

This application is a divisional of U.S. application Ser. No. 10/384,495, filed Mar. 10, 2003, now U.S. Pat. No. 6,720,201.

BACKGROUND OF THE INVENTION

1. Field of the Invention

The present invention relates to a Micro Electro Mechanical System (MEMS) device and a fabrication method thereof. More particularly, the present invention relates to an electrostatic driving MEMS device having a driving electrode in an embedded structure and a fabrication method thereof.

2. Description of the Related Art

Micro Electro Mechanical System is a technology that implements mechanical and electrical parts, using semiconductor processing techniques. A conventional MEMS device generally includes floating driving parts that are movable over a substrate in order for the device fabricated using MEMS technology to perform mechanical operations.

FIG. 1 illustrates a cross-sectional view schematically showing a conventional MEMS device. The conventional MEMS device of FIG. 1 includes a substrate 10, a fixing part 30 attached to the substrate 10, and a driving part 40 extending from the fixing part 30. The fixing part 30 is generally referred to as an anchor or a support. The fixing part 30 connects the driving part 40 to the substrate 10.

The driving part 40 is spaced to float over the substrate 10. The driving part 40 is movable in an upward and downward direction, as shown by the broken lines in FIG. 1. The movement of the driving part 40 is controlled by a predetermined driving force from an electrode part 20 formed on the substrate 10. The driving part 40 is typically fabricated in a shape such as a beam, a membrane, or the like depending on device requirements.

FIG. 2A to FIG. 2E illustrate views for sequentially illustrating stages in a process for fabricating a conventional electrostatic drive-type RF MEMS device.

As shown in FIG. 2A, a driving electrode layer 220, for providing an electrostatic driving force, is formed on a substrate 210 through patterning. In FIG. 2B, a metal layer is formed on the substrate and then the metal layer is patterned so metal layer areas 230 having similar shapes remain. The metal layer areas 230 are an anchor part to acts as a fixing part fixed on the substrate 210 and an RF line to act as input and/or output terminals of an RF signal. The metal layer areas 230 are formed in a thick layer having a thickness of 2 to 3 μm in consideration of the skin depth effect.

Next, referring to FIG. 2C, an insulation layer 240 is formed to surround the driving electrode layer 220 formed on the substrate 210.

Thereafter, as shown in FIG. 2D, a sacrificial layer 250 is formed on the resultant structure on the substrate 210. The sacrificial layer 250 over the anchor part fixed on the substrate 210 is etched through predetermined patterning. Referring to FIG. 2E, a MEMS structure layer is then formed on the patterned sacrificial layer 250. The MEMS structure layer includes a driving part 260 and a connection part 261.

Subsequently, predetermined etching access holes (not shown) are formed in the driving part 260 of the MEMS structure layer, and an etchant is supplied through the etching access holes to selectively etch only the sacrificial layer 250. Accordingly, as shown in FIG. 2E, a conventional MEMS device is fabricated such that the driving part 260 floats over the substrate 210 after the removal of the sacrificial layer 250.

As stated above, a conventional fabrication process proceeds regardless of a step-height difference between the metal layer areas 230 and the driving electrode layer 220. Consequently, a step-height difference between the metal layer areas 230 and the driving electrode layer 220 causes the driving part 260, which is formed by a subsequent procedure, to be formed unevenly, as may be seen in FIG. 2E. Thus, the reliability of such a MEMS device decreases. Moreover, since unevenness of the driving part is not expected during the designing of the device, a significant error exists between the design of the device and the fabrication process. Further, unevenness in the driving part 260 causes a problem in that the driving of the driving part 260 may be incomplete when the MEMS device is driven.

Further, in the stages of the fabrication process shown in FIGS. 2D and 2E, the connection part 261 of the MEMS structure layer, which is formed on an anchor part and the substrate 210, is formed in a bent shape that is relatively thinner than the anchor part and the MEMS structure layer.

Accordingly, the connection part 261 having a thin and bent shape causes a problem in the stability of the MEMS device, since the general operation of the MEMS device involves the movement of the MEMS structure, i.e., the driving part 260.

SUMMARY OF THE INVENTION

In an effort to solve the above problems, it is a feature of an embodiment of the present invention to provide a MEMS device having enhanced reliability and a stable driving capability and a fabrication method thereof.

The above feature of the present invention is provided by a first embodiment wherein a method for fabricating a MEMS device having a fixing part fixed to a substrate, a driving part connected to the fixing part by a connecting part, wherein the driving part is floating over the substrate, a driving electrode for driving the driving part by a predetermined driving force, and contact parts selectively switchable with the driving part, including patterning the driving electrode on the substrate; forming an insulation layer on the substrate on which the driving electrode is formed; patterning the insulation layer and etching a fixing region and a contact region of the insulation layer, in which the fixing part and the contact parts, respectively, are to be formed; forming a metal layer over the substrate including the fixing and contact regions; planarizing the metal layer until the insulation layer is exposed; forming a sacrificial layer on the substrate; patterning the sacrificial layer to form an opening exposing a portion of the insulation layer and the metal layer in the fixing region; forming a MEMS structure layer on the sacrificial layer to partially fill the opening, thereby forming sidewalls therein, wherein the MEMS structure layer forms the fixing part, the driving part and the connection part connecting the fixing part and the driving part on the sacrificial layer; and selectively removing a portion of the sacrificial layer by etching so that a portion of the sacrificial layer remains in the fixing region.

Preferably, the insulation layer is formed as a thick film having a thickness at least as thick as the thickness of the driving electrode so that the driving electrode is embedded in the insulation layer.

Preferably, in the step for forming the opening, the opening is substantially formed over the entire portion remaining except for the portion matched with a connection part connecting the fixing part and the driving part. A width of the connection part is preferably narrower than that of the fixing part.

Before the selective removal of the sacrificial layer, the method preferably further includes forming etching access holes in the MEMS structure layer. Preferably, the etching access holes are formed in the driving part of the MEMS structure layer.

Preferably, the insulation layer is a TetraEthyl OrthoSilicate (TEOS) oxide film. The metal layer is preferably gold. The planarization is preferably performed by polishing. The sacrificial layer is preferably a material selected from the group consisting of aluminum, copper, oxide, and nickel.

The above feature of the present invention may also be provided by a second embodiment wherein a method for fabricating a MEMS device having a fixing part fixed to a substrate, a driving part connected to the fixing part by a connecting part, wherein the driving part is floating over the substrate, a driving electrode for driving the driving part by a predetermined driving force, and contact parts selectively switchable with the driving part, including patterning the driving electrode on the substrate; forming a first insulation layer on the substrate on which the driving electrode is formed; patterning the insulation layer and etching a fixing region and a contact region of the insulation layer, in which the fixing part and the contact parts, respectively, are formed; forming a metal layer over the substrate including the fixing and contact regions; planarizing the metal layer until the driving electrode is exposed; forming a second insulation film covering the driving electrode to electrically isolate the driving electrode and the driving part; forming a sacrificial layer on the substrate; patterning the sacrificial layer to form an opening exposing a portion of the first insulation and the metal layer in the fixing region; forming a MEMS structure layer on the sacrificial layer to partially fill the opening, thereby forming sidewalls therein, wherein the MEMS structure layer forms the fixing part, the driving part, and the connection part connecting the fixing part and the driving part on the sacrificial layer; and selectively removing a portion of the sacrificial layer by etching so that a portion of the sacrificial layer remains in the fixing region.

The above feature of the present invention may also be provided by a MEMS device including a fixing part fixed to a substrate; a driving part connected to the fixing part by a connecting part and floating over the substrate; an electrode part for driving the driving part; and contact parts selectively switchable with the driving part, wherein the electrode part and the contact parts are planarized on the substrate.

Preferably, the electrode part includes an electrode and an insulation layer covering the electrode to electrically isolate the driving part and the electrode, the electrode being embedded in the insulation layer.

The MEMS device preferably also includes an anchor inserted between the fixing part and the substrate for fixing the fixing part on the substrate; and sidewalls on at least a portion of side surfaces of the anchor.

Preferably, the sidewalls are substantially formed over the entire portion remaining except for a portion corresponding to a connection part connecting the fixing part and the driving part. A width of the connection part is preferably narrower than that of the fixing part.

The sidewalls, fixing part, and driving part are preferably integrally formed in one body, and the sidewalls are in contact with the substrate.

Accordingly, the step difference between the RF lines and the driving electrode is removed, so the MEMS structure layer to be subsequently formed for the driving part driven by an electrostatic force can be prevented from being transformed.

BRIEF DESCRIPTION OF THE DRAWINGS

The above features and advantages of the present invention will become more apparent to those of ordinary skill in the art by describing in detail preferred embodiments thereof with reference to the attached drawings in which:

FIGS. 3A to 3F illustrate views sequentially showing stages in a process for fabricating an electrostatic drive-type RF MEMS relay according to an embodiment of the present invention; and FIG. 4A to FIG. 4G illustrate views sequentially showing stages in a process for fabricating an electrostatic drive-type RF MEMS relay according to another embodiment of the present invention.

DETAILED DESCRIPTION OF THE INVENTION

Figure 1:
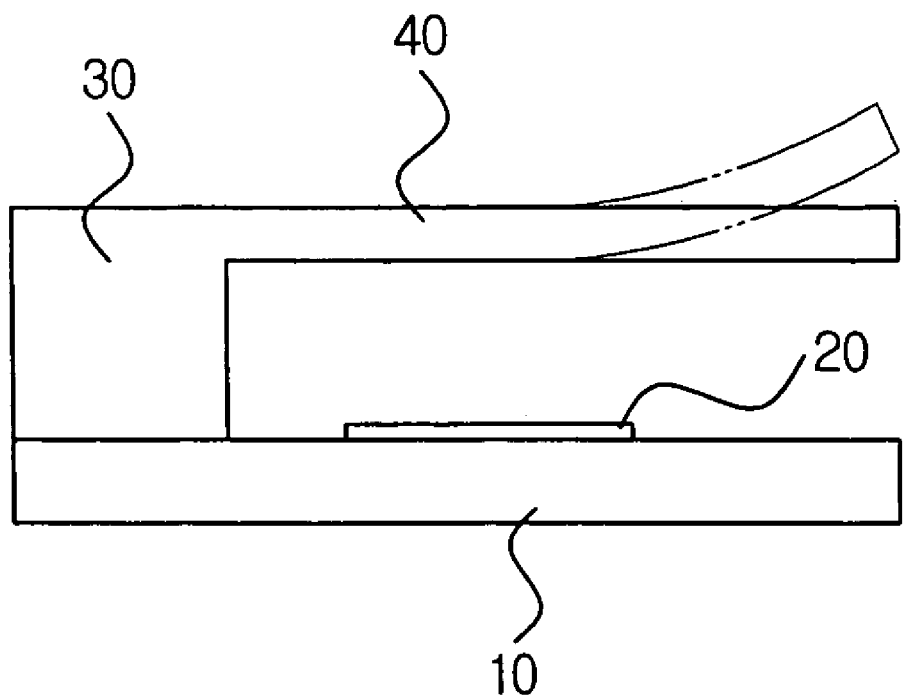
FIG. 1 illustrates a cross-sectional side view schematically showing a conventional MEMS device.
Figure 2A:
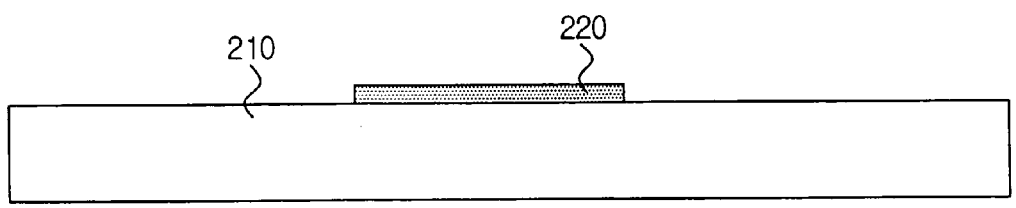
FIGS. 2A to 2E illustrate views sequentially showing stages in a conventional process for fabricating an electrostatic drive-type MEMS device.
Figure 2B:
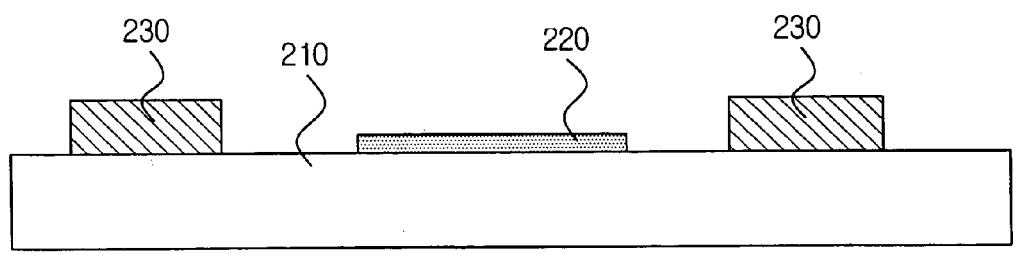
Figure 2C:
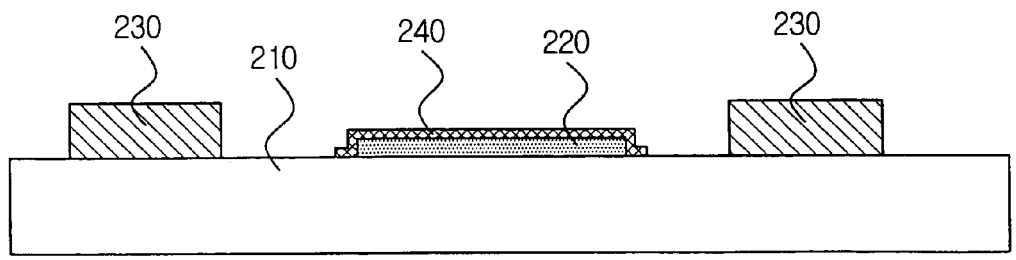
Figure 2D:
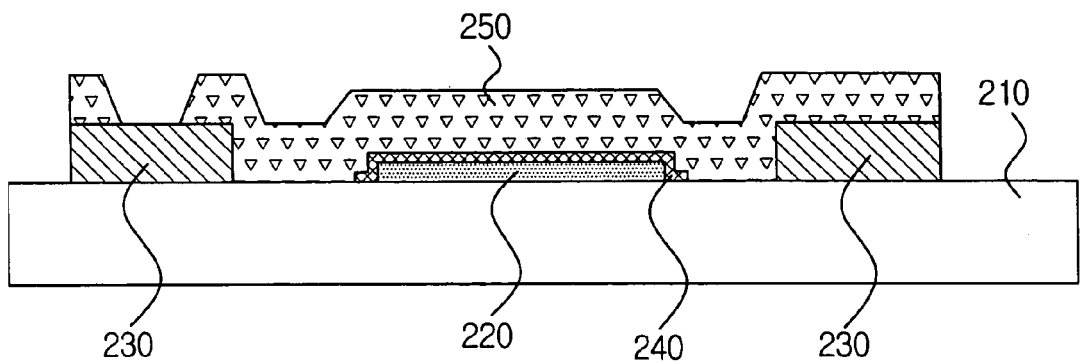
Figure 2E:
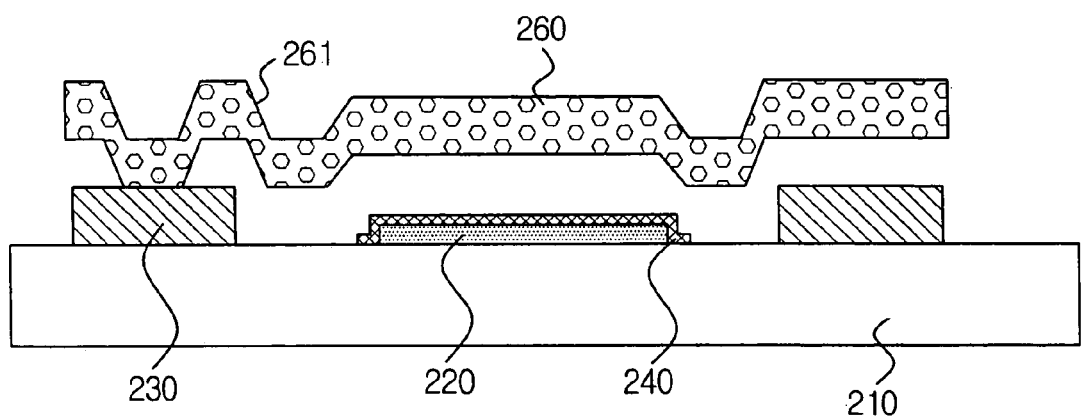

Korean Patent Application No. 2002-12985, filed on Mar. 11, 2002, and entitled: "MEMS Device and Fabrication Method Thereof," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

An electrostatic drive-type RF MEMS relay is described below as a MEMS device according to an embodiment of the present invention.

FIG. 3A to FIG. 3F illustrate views for sequentially showing stages in a process for fabricating an electrostatic drive-type MEMS relay according to an embodiment of the present invention.

Figure 3A:
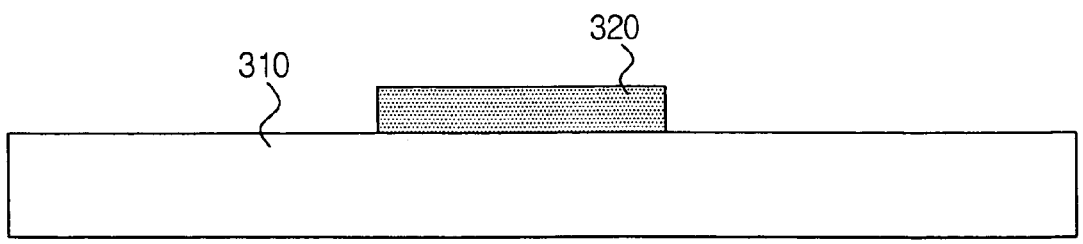
Figure 3B:
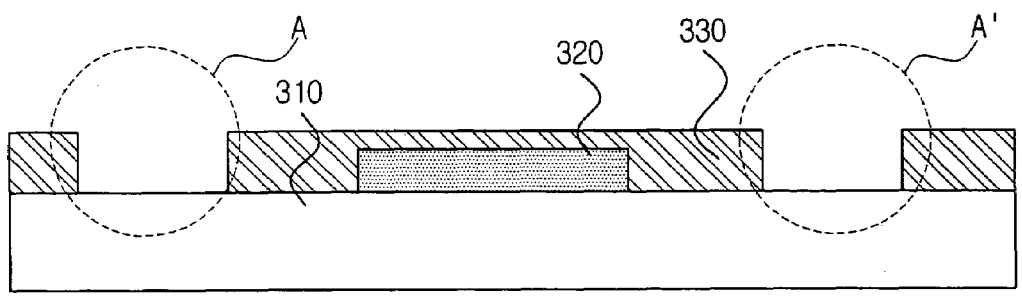

First, as shown in FIG. 3A, a driving electrode layer 320 for providing an electrostatic driving force is formed on a substrate 310 through patterning. As shown in FIG. 3B, a flattening mold 330 is formed as an insulation layer on the substrate 310 on which the driving electrode layer 320 is formed. A TetraEthyl OrthoSilicate (TEOS) oxide film is preferably used for the insulation layer.

Thereafter, the flattening mold 330 of the insulation layer is patterned, and the regions for an anchor part A of the MEMS relay and a contact part A' for input and output terminals of an RF signal are etched. That is, the insulation layer 330 formed in the flattening mold becomes an insulation layer of the driving electrode layer 320. The electrode layer 320 is formed to prevent an electric short-circuit of the driving electrode layer 320 and a driving part to be described later.

Figure 3C:
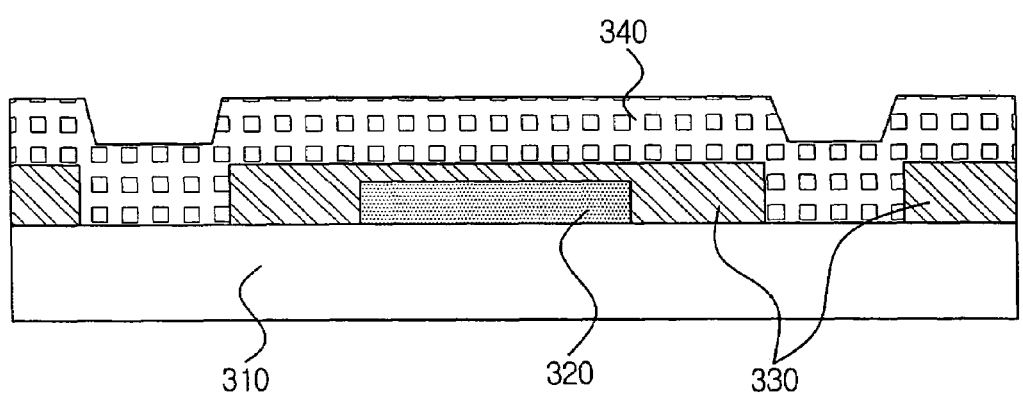

Next, as shown in FIG. 3C, a metal layer 340 is formed to a predetermined thickness on the resultant structure and on the substrate where regions of the anchor part A and the contact part A' are etched. For example, gold (Au), a metal substance having excellent conductivity, is preferably used for the metal layer 340.

Figure 3D:
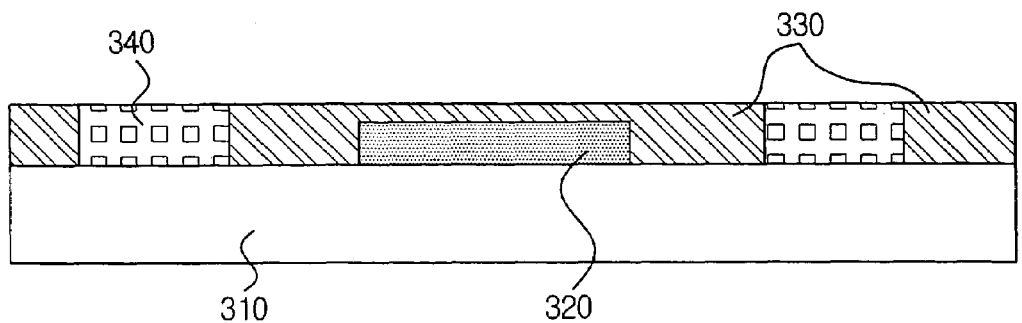

Subsequently, the substrate on which the metal layer 340 is formed to a predetermined thickness is planarized. This planarization is preferably performed by polishing. In a case where the planarization is performed by polishing, an amount of time until the insulation layer 330, which is formed underneath the metal layer 340, is exposed is monitored so that it may be determined for how long to perform the planarization. That is, as shown in FIG. 3D, the polishing progresses until the insulation layer 330 is exposed.

After the planarization, the metal layer 340 for the RF lines is formed in a thick film having a thickness of about 2 to 3 μm in consideration of the skin depth effect, for which the flattening mold 330 of the insulation layer is formed in the thick film having a thickness of at least about 2 to 3 μm.

Accordingly, the metal layer 340 is formed on the anchor part A and the RF line part A' to a thickness matching the thickness of the insulation layer mold previously processed, so that the electrode part in which the driving electrode layer 320 and the insulation layer 330 are formed and the RF lines are evenly formed with respect to thickness, i.e., there is no difference of step heights.

Thus, an electrostatic drive-type MEMS relay is formed having a structure in which the driving electrode 320 thereof is embedded in the insulation layer 330.

Next, as shown in FIG. 3E, a sacrificial layer 350 is formed on the resultant structure on the planarized substrate 310, and the sacrificial layer 350 is etched to form a groove-shaped opening in one rim portion B of the anchor part A through a predetermined patterning. The sacrificial layer 350 may be formed of material such as aluminum (Al), copper (Cu), oxide, nickel (Ni), or the like.

As shown in FIG. 3F, a MEMS structure layer 360 is formed on the patterned sacrificial layer 350. The MEMS structure layer 360 includes an anchor part and a driving part and is formed of a deposited metal layer of a substance such as gold (Au). Accordingly, the MEMS structure layer 360 is formed in the groove-shaped opening formed in the rim portion B of the anchor part, and the MEMS structure layer 360 is also formed on the resultant structure on the substrate 310 on which the sacrificial layer 350 is formed.

Subsequently, predetermined etching access holes (not shown) are formed in the driving part of the MEMS structure layer 360, which is to be driven by the driving electrode 320. Then, an etchant able to selectively etch only the sacrificial layer 350 is supplied through the etching access holes. Accordingly, the sacrificial layer 350 is removed, as shown in FIG. 3F, so that a MEMS relay having the driving part of the MEMS structure layer 360 floating over the substrate 310 is fabricated.

At this time, a sidewall C is formed in the connection part between the anchor part and the driving part of the MEMS structure layer 360 formed in the rim B of the anchor part, as shown in FIG. 3F, so that a portion of the sacrificial layer 350 adjacent to the connection part and the anchor part in the rim B is not removed by the etchant.

As stated above, a step-height difference, that is, a difference in thickness between the metal layers 340 for the RF lines of the contact parts and the driving electrode 320 formed in a structure embedded in the insulation layer 330 of the electrode part is eliminated through the planarizing process, so that a MEMS relay having enhanced reliability and a stable drive capability may be fabricated.

Further, a step for forming the insulation layer 330 on the driving electrode layer 320 compared to the prior art can be excluded, to thereby simplify a fabrication process.

Additionally, a portion of the sacrificial layer 350 near the anchor part remains by the sidewall C formed in the connection part between the anchor part A and the driving part of the MEMS structure layer 360, so that a MEMS device having greater stability may be fabricated.

FIG. 4A to FIG. 4G illustrate views for sequentially showing stages in a planarizing process for an electrostatic drive-type MEMS relay according to another embodiment of the present invention, in which a driving electrode layer 420 formed on the substrate 410 is formed without a step-height difference with respect to metal layer areas 440 of RF lines.

Figure 4B:
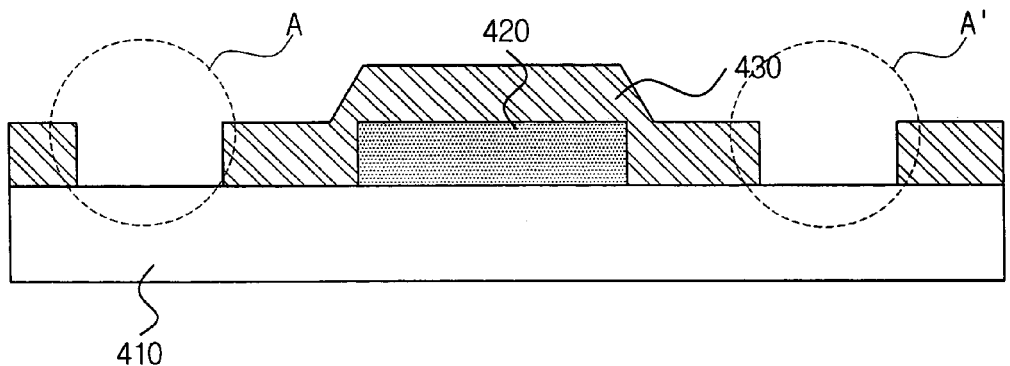

First, as shown in FIG. 4A, a driving electrode layer 420 for providing an electrostatic driving force is patterned on a substrate 410 and is formed to a predetermined thickness. Next, as shown in FIG. 4B, a first insulation layer 430 is formed on the substrate 410 on which the driving electrode layer 420 is formed. Thereafter, the regions of the anchor part A of the MEMS relay and the contact parts A' of the RF lines are patterned and etched.

Figure 4C:
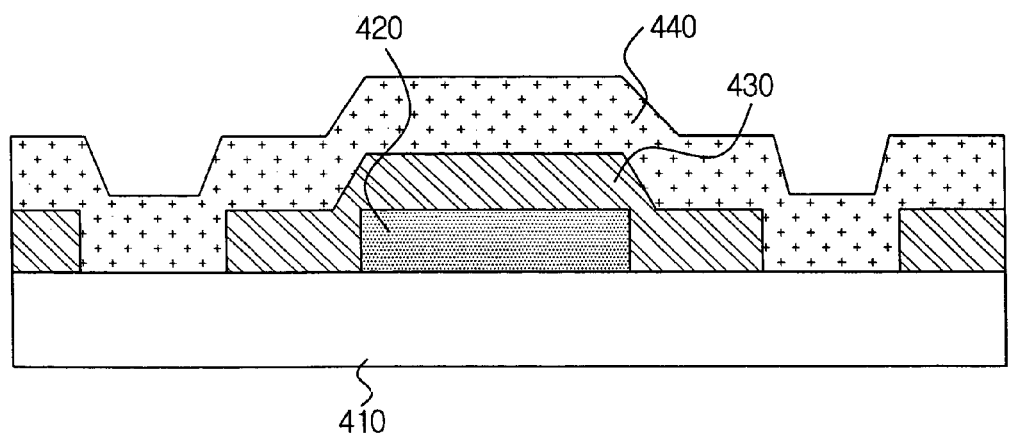

Next, as shown in FIG. 4C, a metal layer 440 is deposited to a predetermined thickness on the resultant structure on the substrate and on the substrate 410 in the regions where the anchor part A and the contact part A' have been etched.

Figure 4D:
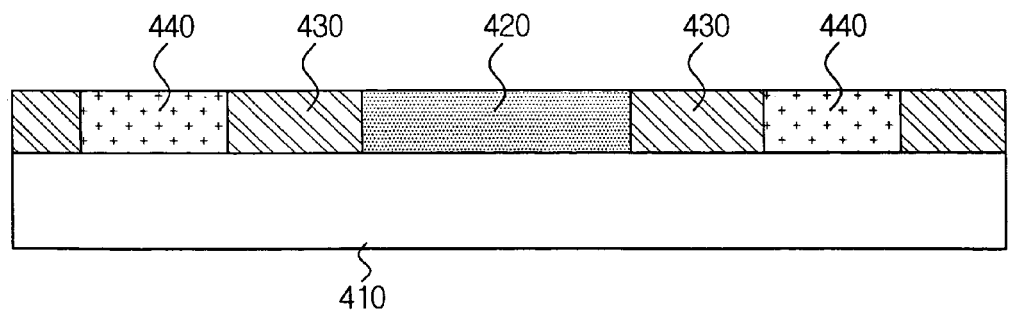

A planarizing step is then performed through the polishing of the resultant structure on the substrate on which the metal layer 440 is formed to a predetermine thickness. As shown in FIG. 4D, the polishing progresses until the driving electrode layer 420 is exposed. Further, the metal layer areas 440 of the RF lines are polished so as to be formed in a thick film having a thickness of between about 2 to 3 μm in consideration of the skin depth effect.

Figure 4E:
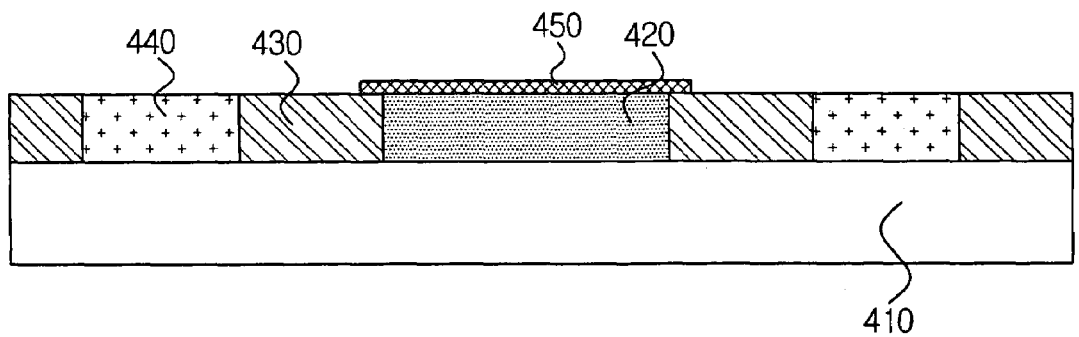

Next, as shown in FIG. 4E, a second insulation layer 450 covering the driving electrode layer 420 is formed.

Accordingly, the metal layer areas 440 of the contact part and the driving electrode layer 420 are formed having a planarized surface as compared to the prior art.

Figure 4F:
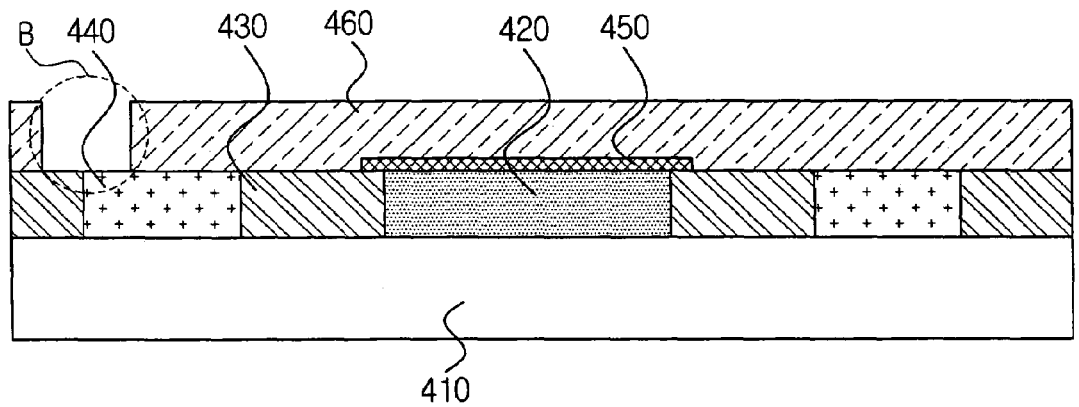
Figure 4G:
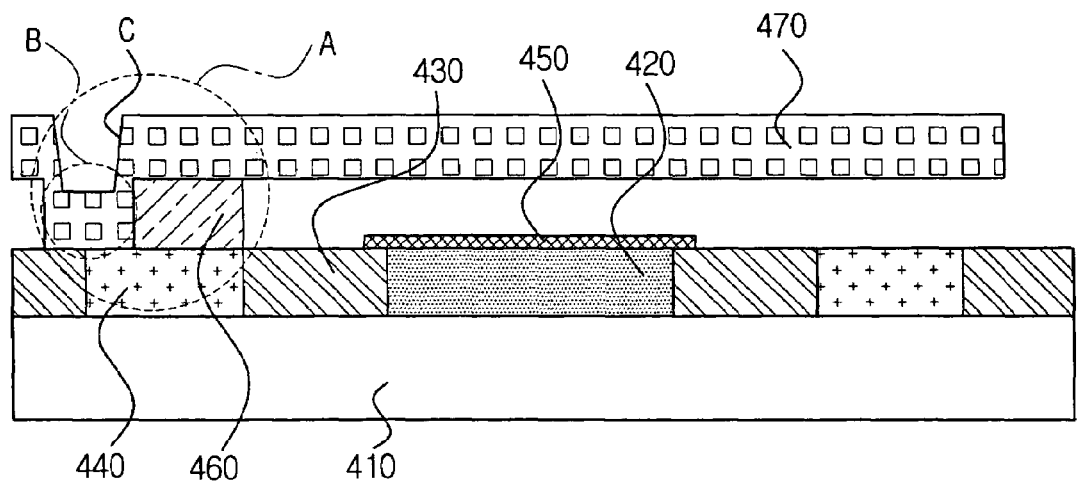

Next, the fabrication stages shown in FIGS. 4F and 4G are similar to the stages shown in FIGS. 3E and 3F in connection with the first-described embodiment of the present invention and a further description thereof will be omitted.

As stated above, the step-height difference between the metal layer areas 440 of RF lines and the driving electrode 420 is eliminated so that the driving part of MEMS structure layer 470 fabricated in the subsequent steps is prevented from being transformed and a MEMS device having a greater stability may be fabricated.

Accordingly, a MEMS relay having enhanced reliability and a more stabilized drive capability may be fabricated.

According to the present invention, the step difference between the RF lines and the driving electrode is eliminated, so the MEMS structure layer to be subsequently formed for the driving part, which is driven by an electrostatic force, may be prevented from being transformed.

Further, a portion of the sacrificial layer near the anchor part remains by the sidewall formed in the connection part between the anchor part and the driving part, so that a more stable MEMS device may be fabricated.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A MEMS device, comprising:
   a fixing part fixed to a substrate;
   a driving part connected to the fixing part by a connecting part and floating over the substrate;
   an electrode part for driving the driving part, the electrode part including an electrode and an insulation layer covering the electrode to electrically isolate the driving part and the electrode; and
   contact parts selectively switchable with the driving part, wherein the electrode part and the contact parts are planarized on the substrate.

2. The MEMS device as claimed in claim 1, further comprising:
   an anchor inserted between the fixing part and the substrate for fixing the fixing part on the substrate; and
   sidewalls on at least a portion of side surfaces of the anchor.

3. The MEMS device as claimed in claim 2, wherein the sidewalls are substantially formed over the entire portion remaining except for a portion corresponding to the connection part connecting the fixing part and the driving part.

4. The MEMS device as claimed in claim 2, wherein the sidewalls, fixing part, and driving part are integrally formed in one body.

5. The MEMS device as claimed in claim 4, wherein the sidewalls are in contact with the substrate.

6. The MEMS device as claimed in claim 2, further comprising a support structure adjacent a sidewall and between the anchor and a contact part under the anchor.

7. The MEMS device as claimed in claim 6, wherein the support structure is at least one of aluminum, copper, oxide and nickel.

8. The MEMS device as claimed in claim 1, wherein a width of the connection part is narrower than that of the fixing part.

9. The MEMS device as claimed in claim 1, wherein the electrode is embedded in the insulation layer.

10. The MEMS device as claimed in claim 9, wherein the insulating layer is integral in a single layer.

11. The MEMS device as claimed in claim 9, wherein the insulating layer includes a first insulating layer around sides of the electrode part and a second insulating layer on top of the electrode part.

* * * * *